United States Patent [19]
Bauer et al.

[11] Patent Number: 5,274,278
[45] Date of Patent: Dec. 28, 1993

[54] HIGH-SPEED TRI-LEVEL DECODER WITH DUAL-VOLTAGE ISOLATION

[75] Inventors: Mark E. Bauer, Cameron Park; Peter Hazen, Sacramento; Sherif Sweha, El Dorado Hills, all of Calif.

[73] Assignee: Intel Corporation, Santa Clara, Calif.

[21] Appl. No.: 816,155

[22] Filed: Dec. 31, 1991

[51] Int. Cl.⁵ .................... H03K 19/20; H03K 19/082
[52] U.S. Cl. .................................. 307/449; 307/463; 365/230.06
[58] Field of Search .................. 307/449, 468, 463; 365/189.01, 230, 231, 230.06

[56] References Cited

U.S. PATENT DOCUMENTS

| | | | |
|---|---|---|---|
| 4,455,629 | 6/1984 | Suzuki et al. | 307/449 |
| 4,820,941 | 4/1989 | Dolby et al. | 307/449 |
| 4,953,133 | 8/1990 | Kashimura | 365/230.06 |
| 4,982,372 | 1/1991 | Matsuo | 365/230.06 |
| 5,062,082 | 10/1991 | Choi | 365/230.06 |

Primary Examiner—Edward P. Westin
Assistant Examiner—Richard Roseen
Attorney, Agent, or Firm—Blakely, Sokoloff, Taylor & Zafman

[57] ABSTRACT

In a memory array in which logic signals of a first and a second voltage levels are used for selecting memory positions in the array for read operations and at least one signal of a voltage level higher than the first and second voltage levels may appear, and including a plurality of wordlines each joined to a common node by individual row decoders, a predecoder circuit for selecting a plurality of wordlines from which a row decoder may select an individual wordline including a full CMOS NAND gate arranged to provide output voltage levels of the first and a second voltage levels, a plurality of weak P channel devices each connected to one of the wordlines, means for operating the weak P channel devices to provide voltage levels of the higher level and below at the wordlines, means for limiting value of voltage transferred to the common point to be less than the higher voltage level, and means for limiting the level of the voltage transferred to the common node from the NAND gate to be less than a predetermined level.

6 Claims, 2 Drawing Sheets

HIGH-SPEED TRI-LEVEL DECODER WITH DUAL-VOLTAGE ISOLATION

BACKGROUND OF THE INVENTION

1. Field Of The Invention

This invention relates to memory array circuitry and, more particularly, to decoding circuitry which may be used with three levels of voltages to provide accelerated row decoding.

2. History Of The Prior Art

There are a number of types of non-volatile memory arrays utilized to store digital information. Erasable read only memory (EPROM) and extensions of EPROM such as flash EPROM are used for many purposes. In general, such arrays are comprised of many transistors arranged in rows and columns with selection circuitry for determining the particular transistors to access. There has been a general tendency for such arrays (as for all memory arrays) to grow larger by including more and more memory transistors. As the number of transistors in a memory array connected to any selection line (such as a wordline or bitline) increases so does the capacitance affecting the line. This has the general tendency of slowing the rate at which switching can be accomplished.

The typical circuitry for accomplishing wordline decoding in an EPROM or a flash EPROM memory array utilizes a NAND gate as a predecoder circuit. This predecoder circuit is used to select a number of wordlines from a total of all wordlines, and then the individual wordline is selected from that first number of wordlines by one of a plurality of row decoder transistors connected in common to the output of the NAND gate.

In a non-volatile memory array, typically two separate voltage supplies are provided. One voltage supply, Vcc, is typically five volts and is used for reading the contents of the memory array. A second voltage supply, Vpp, is typically twelve volts and is used for programming and erasing the contents of the memory array. The row decoding circuitry must be designed to allow the transfer of both of these voltage levels onto the wordline. Typically, an internal voltage supply node exists which can be switched between the two external voltage supply values. This internal voltage supply node is connected to the row decoding circuitry to supply one or the other of the supply voltages.

The typical NAND gate used as a predecoder in these non-volatile arrays is made of one or more N channel field effect transistors (FETs) with their drain and source terminals connected in series between ground and an output terminal and a P channel field effect transistor with its source and drain terminals connected between a source of voltage (typically the internal voltage supply node) and the output terminal. The P channel device is a weak device which is biased "on." Selection signals are applied to the gates of the N channel devices. When high valued inputs equal to Vcc, which is typically five volts, are placed on the gates of the N channel devices, a low value is transferred to the NAND gate output. When any other signals are placed on the gates of the N channel devices, the P channel device furnishes a high value (equal to the internal voltage supply value, which is typically either five volts or twelve volts) to the output of the NAND gate. The output of the NAND gate is connected to the input of an inverter joined between the internal voltage supply and ground whose output drives the wordline of the array. The type of NAND gate described is referred to as a ratioed NAND gate.

One reason a ratioed NAND gate is used in the decoding circuitry associated with the wordlines of EPROM and similar arrays is that these arrays operate with both the normal source voltage (five volts) and with the higher source voltage (twelve volts) used to program the array. The typical full CMOS NAND gate having a pair of N channel devices joined in series between ground and an output node and a pair of P channel devices connected in parallel to the source voltage and the output node would not function correctly when the higher source voltage appears as the source voltage unless the CMOS NAND gate includes additional more complex circuitry which is not optimum for high speed decoding. For this reason, the ratioed arrangement using a weak P channel device which is capable of operating with all of the voltages to be expected is used.

However, because the current to the common node to which the row decoders are connected is furnished through a weak P device in a ratioed NAND gate, a relatively small current is available to accomplish the charging of the parasitic capacitance at the common node to which the row decoders are joined. Consequently, the time for deselection at a wordline is longer than is desirable. Slow deselection of the wordline slows down the transition to a newly selected wordline because the previously selected wordline remains selected for a longer period of time. On the other hand, with the increase in the number of memory transistor devices in the arrays, accelerated switching is necessary to overcome wordline delay and provide correct operation of the arrays.

In addition, it is necessary to optimize the voltage level at the point in time when a wordline being selected crosses a wordline being deselected in order to maintain optimum operation of the sense amplifier. If wordline deselection is too slow, this voltage level will be high, and two memory cells will be simultaneously selected. This, in addition to slowing down the access time, will not maintain optimum operation of the sense amplifiers.

SUMMARY OF THE INVENTION

It is, therefore, an object of the present invention to increase the speed with which wordlines are deselected and to provide increased control over wordline deselection in EPROM and similar memory arrays.

It is another object of the present invention provide voltage isolation in circuitry designed to increase the speed with which wordlines are deselected in EPROM and similar memory arrays which require two or more high voltage levels to be transferred to the wordline.

It is another, more specific, object of the present invention provide apparatus for allowing the rapid selection and deselection of the wordlines of EPROM and similar memory arrays which require two or more high voltage levels to be transferred to the wordlines.

These and other objects of the present invention are realized in a memory array in which logic signals of first and second voltage levels are used for selecting memory positions in the array for read operations and at least one signal of a voltage level higher than the first and second voltage levels may appear, and including a plurality of wordlines each joined to a common node by individual row decoders, a predecoder circuit for selecting a plurality of wordlines from which a row decoder may select an individual wordline comprising a full CMOS NAND gate arranged to provide output voltage levels of the first and the second voltage levels, a plurality of weak P channel devices each connected to one of the wordlines, means for operating the weak P channel devices to provide voltage levels of the higher level and below at the wordlines, means for limiting value of voltage transferred to the common point to be less than the higher voltage level, and means for limiting the level of the voltage transferred to the common node from the NAND gate to be less than a predetermined level.

These and other objects and features of the invention will be better understood by reference to the detailed description which follows taken together with the drawings in which like elements are referred to by like designations throughout the several views.

DETAILED DESCRIPTION OF THE INVENTION

Figure 1:
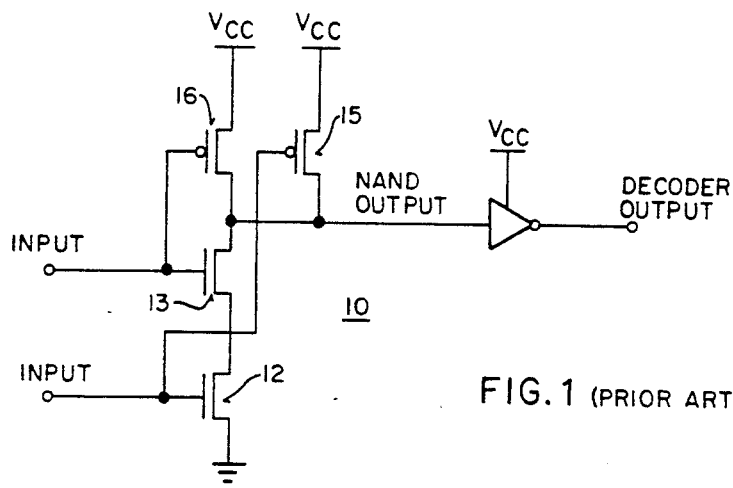
FIG. 1 is a circuit diagram illustrating a prior art arrangement for selecting a particular wordline in other than tri-level memory circuitry.

Referring now to FIG. 1, there is illustrated a full CMOS NAND gate 10 which is typically used as a predecoder portion of a memory array selection circuit utilized for selecting a block of wordlines from which one of a plurality is selected. The NAND gate 10 includes a pair of N channel field effect transistor devices 12 and 13 and a pair of P channel field effect transistor devices 15 and 16. Each of the N channel devices 12 and 13 has its source and drain terminals connected in series with the source and drain terminals of the other device between ground and an output terminal. Each of the P channel devices 15 and 16 has its source and drain terminals connected between a source voltage Vcc (five volts) and the output terminal. The gates of the devices 12 and 15 are connected together to one input terminal and the gates of the devices 13 and 16 are connected together to a second input terminal. The output of the NAND gate is connected to an inverter whose output is the predecoder input to the row decoder.

Typically the values applied to the input terminals of a full CMOS NAND gate are the source voltage (typically five volts) and ground. If ground is applied to both input terminals, the two P devices 15 and 16 are on, the two N devices 12 and 13 are off, and a high voltage close to the source voltage (Vcc) appears at the output terminal. This level is inverted so the predecoder output is at zero volts. If the source voltage (Vcc) is applied to both input terminals, the two N devices 12 and 13 are on, the two P devices 15 and 16 are off, and a low voltage close to ground appears at the output terminal of the NAND gate. This level is inverted so the predecoder output is at a voltage very close to the source voltage (Vcc). If the voltages at the input terminals differ, one of the P devices is on; and one of the N devices is on. No path exist from ground so a high value appears at the output terminal of the NAND gate, and a low value appears at the predecoder output.

The typical full CMOS NAND gate works well in memory array circuits in which only two voltages, ground and the source voltage, are used. However, as pointed out above, EPROM and similar memory circuit arrays such as flash EPROM utilize an additional higher level voltage (twelve volts) as a programming voltage. In the typical arrangement for selecting wordlines in an EPROM memory array, this higher level voltage would appear at the common node to which the output terminal of the NAND gate 10 is connected if a CMOS NAND gate were used for wordline selection. These P channel devices are MOSFETs which typically have the body of the transistor connected to the source voltage so that a p-n junction diode is formed between the output terminal of the nand gate and the body of the P devices. The effect of this voltage is to forward bias the p-n junction of the P channel devices 15 and 16 causing those devices to malfunction. Consequently, the NAND gate 10 described has not been utilized in EPROM and similar memory arrays using three levels of voltages.

Figure 2:
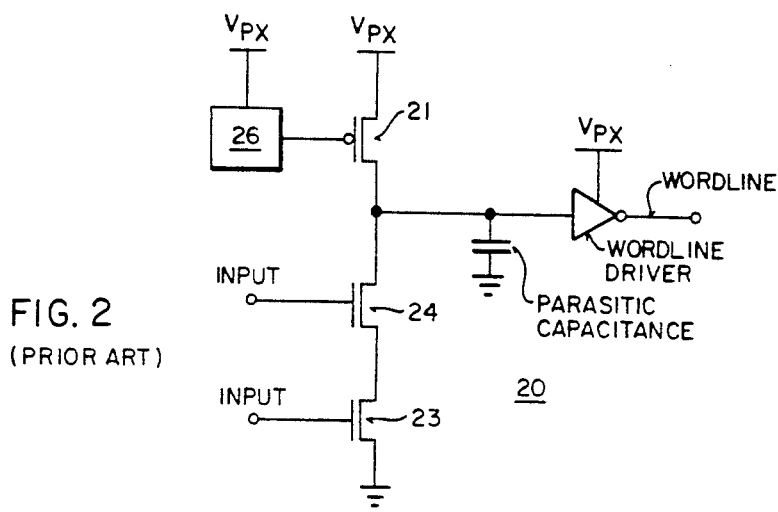
FIG. 2 is a circuit diagram illustrating another prior art arrangement for selecting a particular wordline.

Instead, a ratioed NAND gate circuit 20 (illustrated in FIG. 2) is typically utilized to provide the selection input for EPROM and similar memory array circuitry utilizing three voltage levels. As may be seen, rather than including a full CMOS NAND gate with two P channel devices and two N channel devices as illustrated in FIG. 1, the circuit 20 utilizes a single P channel device 21 between the source and the ratioed NAND gate output terminal. A pair of N channel devices 23 and 24 are connected in series between ground and the output terminal and receive the input signals at their gate terminals. The P channel device 21 is a weak device which provides minimal current contrasted to the current furnished by the N channel devices 23 and 24. This is necessary so that, when the gates of the N channel devices are at five volts (Vcc), they can pull down the output terminal of the ratioed NAND gate. The gate of this device 21 is biased by a bias circuit 26 which receives the source voltage Vpx as an input. The source voltage is designated as Vpx to indicate that it may vary from the high level programming value of twelve volts down to any source voltage value above ground. The bias circuit 26 is a switch which applies a voltage to the gate of the device 21 so that the device 21 is always on and always conducts weakly. If the voltage Vpx varies from five volts to twelve volts, the device 21 still remains on in the weak condition. Thus, this device is able to function with varying source voltages to furnish the values necessary for both read operations and during programming.

If the input signals to the gate terminals of the devices 23 and 24 are both high (five volts), these devices provide a substantial current path so that the output node is pulled to approximately ground. If on the other hand, one or both of the input signals is low, the path to ground is closed; and the weak device 21 acts as a pull up device to place the output at approximately Vpx (typically five volts in the read condition of the array). However, since both the biasing level and the source voltage of the circuit 20 vary together, the device 21 remains on and will function as a weak device whether Vpx is five volts (used during read operations), twelve volts (used in programming), or some other value between ground and twelve volts.

However, it has been found in use that the circuit 20 which relies on a weak P device to provide current for charging the parasitic capacitance of the common node connected to the plurality of row selection transistors is too slow in operation. Insufficient current can be furnished by the weak P devices to charge or discharge the line capacitance rapidly enough for the desired circuit specifications. Consequently, the row selection and deselection times must be extended, slowing the operation of the array. Even when the row selection and deselection times are extended, however, two word lines will be selected at the same time leading to non-optimum operation during a significant percentage of time. Memory cells in two individual rows will be providing output signals during the transition period in which a new row is being selected and an old row is being deselected. This causes the signals provided to the array sense amplifiers to be different than expected.

Figure 3:
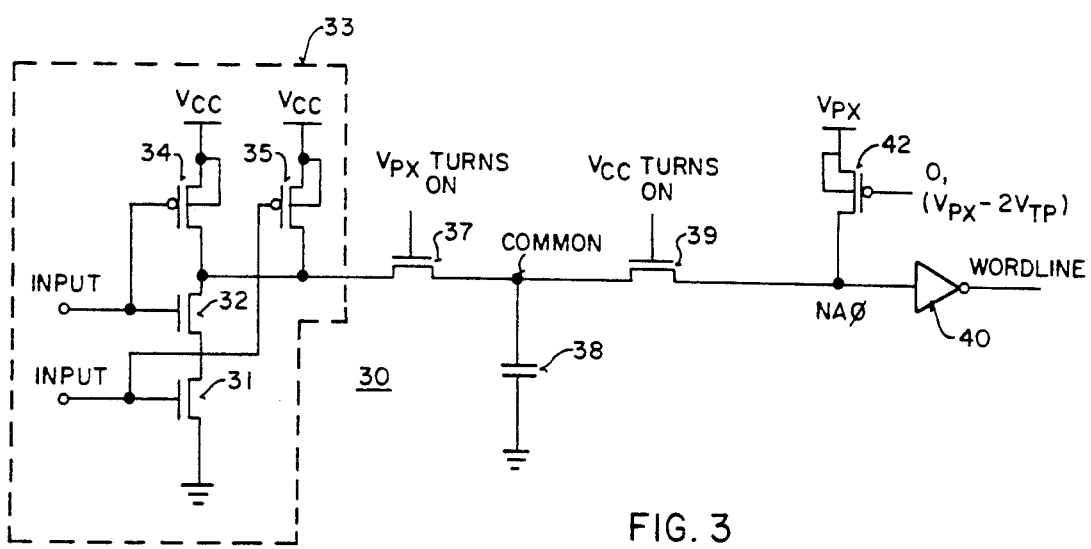
FIG. 3 is a circuit diagram of an arrangement for selecting a particular wordline in accordance with the present invention.
Figure 4:
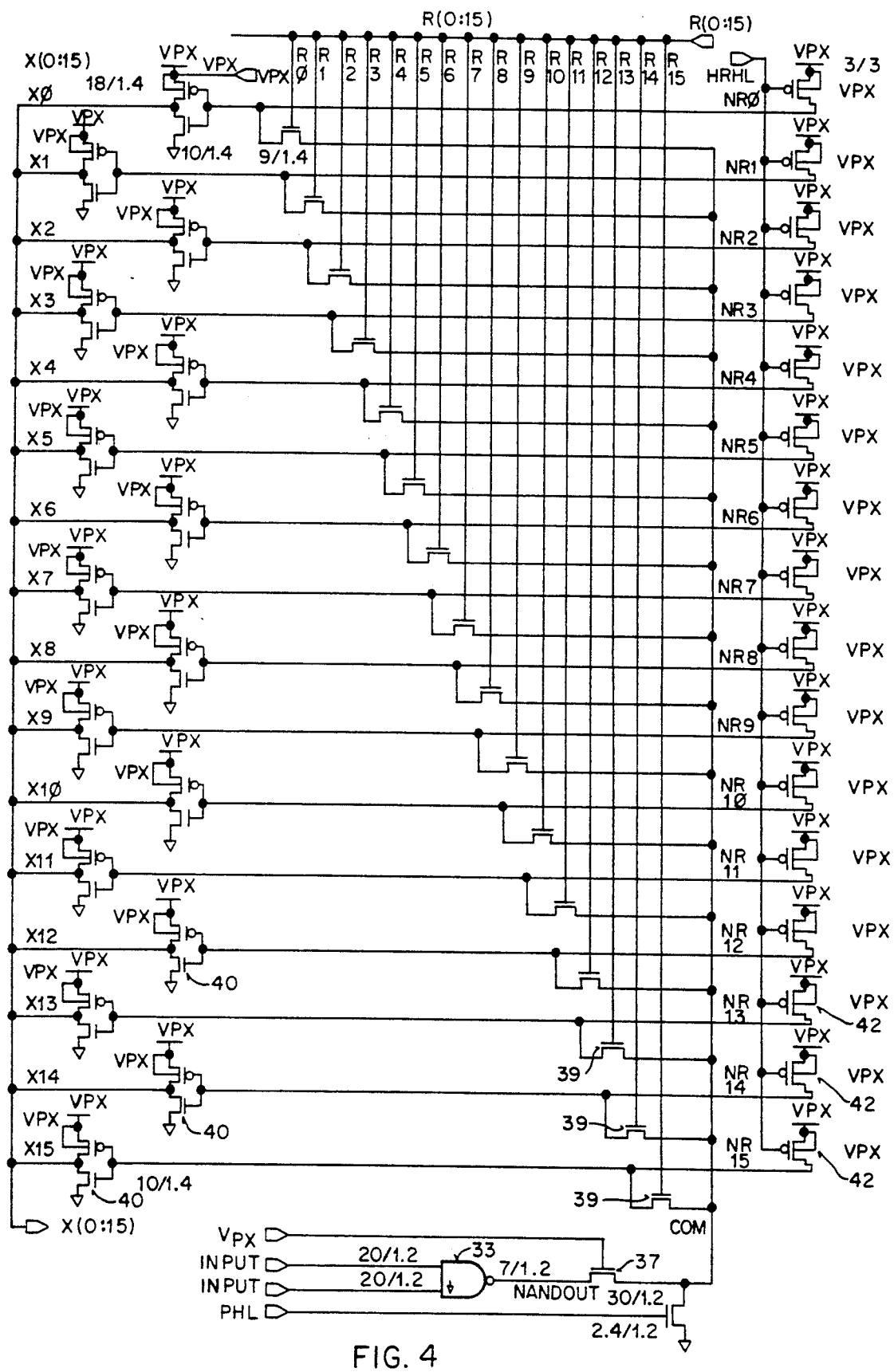
FIG. 4 is another circuit diagram of a portion of the selection circuitry of an EPROM memory array in accordance with the present invention.

The circuit 30 illustrated in FIGS. 3 and 4 overcomes the problems of each of the prior art circuits illustrated above in FIGS. 1 and 2. FIG. 3 illustrates the circuit 30 in isolation while FIG. 4 shows a portion of a memory array in which the circuit 30 is utilized. This circuit 30 utilizes a full CMOS NAND gate 33 as a predecoder circuit. The NAND gate 33 includes a pair of N channel field effect transistor devices 31 and 32 connected in series between ground and an output terminal and a pair of P channel field effect transistor devices 34 and 35 each connected between a source of voltage Vcc and the output terminal. The gate terminals of the devices 31 and 35 are connected together to receive the same input signal, and the gate terminals of the devices 32 and 34 are connected together to receive a second input signal. When both input signals are high, the two devices 31 and 32 both conduct; and a low voltage is furnished at the output terminal. For any other combination of input signals, at least one of the P devices 34 or 35 is on providing a high value close to Vcc at the output terminal.

The output terminal of the NAND gate 33 connects to the common node through an N channel field effect transistor device 37. A capacitor 38 is shown to illustrate the effect of the parasitic capacitance which must be overcome in switching between wordlines. An N channel field effect transistor device 39 is arranged as a row decoder between the common node and an output driver 40 for any particular wordline. Also connected to the input to the output driver 40 is a P channel field effect transistor 42. The P channel device 42 is weak device which is biased on so that it furnishes Vpx at the input to the output driver when the row decoder device 39 for that particular row is disabled. To accomplish this, the value at the gate terminal if the array is being read is ground and the value of Vpx is five volts. If the array is being programmed, the gate terminal receives a voltage equal to Vpx minus twice the threshold value (Vtp) of the device 42 so that approximately twelve volts appears at the input to the driver 40.

In order to assure that the twelve volts furnished by the device 42 is not transferred back to the output of the NAND gate 33 to forward bias the p-n junctions of the devices 34 and 35 and cause the circuit to malfunction, the row decoder device 39 is driven to the on condition by Vcc (five volts) at its gate terminal. This limits the value of voltage which may be transferred to the common node to Vcc minus the threshold voltage Vt of the device 39 or somewhat less than five volts.

By utilizing the source voltage Vcc as the driving voltage for device 39, the twelve volts furnished by the device 42 cannot be transferred back to the output of the NAND gate 33 to forward bias the p-n junctions of the devices 34 and 3 and cause the circuit to malfunction. This allows the full CMOS NAND gate 33 to be utilized for the predecode selection in the array. The full CMOS NAND gate 33 provides a pair of P channel devices 34 and 35 each of which functions as a switch to furnish current from the source voltage Vcc for charging the common node capacitance. These devices 34 and 35 are typical strong P devices able to transfer substantial amounts of current in contrast to the weak P channel device used for charging the common node capacitance in ratioed NAND gate arrangements of the prior art. Consequently, the improved predecoder selection circuitry allows deselection of the word lines to occur much faster than with the prior art arrangements.

In addition to the elimination of the potential for forward biasing the P devices 34 and 35 of the NAND gate 33 in the condition in which Vpx is twelve volts, the device 37 is placed in the path between the output of the NAND gate 33 and the common node in order to eliminate the possibility of the p-n junction of the device 42 being forward biased in the condition in which Vpx is at a low value (lower than Vcc minus Vtn, where Vtn is the threshold voltage of device 39). If, for example, Vpx is three volts and one of the devices 34 or 35 is enabled, a voltage of approximately five volts appears at the output of the NAND gate 33. Without the device 37, this five volts (minus Vtn) would be applied at the input terminal of the driver 40. With the source voltage Vpx at three volts, this would forward bias the p-n junction of the device 42 and cause it to malfunction.

However, the device 37 is enabled with the value Vpx at its gate terminal. Consequently, the voltage which can be transferred to the common node from the output of the NAND gate 33 is Vpx less the threshold voltage Vt drop of the device 37, thus guaranteeing that the p-n junction of device 42 will not forward bias.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A word line decoder circuit for a memory array having a plurality of word lines for selecting a selected word line from the plurality of word lines, comprising:
 a CMOS NAND gate coupled to receive a plurality of input signals for selecting a number of word lines from the plurality of word lines, wherein the NAND gate includes an output, wherein the output can be at a first voltage and second voltage, wherein when the output of the NAND gate is at the first voltage, the number of word lines are selected;
 circuitry coupled to the output of the NAND gate and a common node and coupled to receive an input voltage, for limiting a first node voltage transferred to the common node from the NAND gate to be less than a third voltage when the output of the NAND gate is at the second voltage, wherein the third voltage is less than or equal to the second voltage, wherein the input voltage can be one of the third voltage and a fourth voltage, wherein the fourth voltage is greater than the second voltage;

a number of row decoding and voltage limiting circuits, each coupled to one of the number of word lines and the common node for selecting the selected word line from the number of word lines to couple to the common node and for limiting a second node voltage transferred to the common node from the selected word line to be less than the second voltage;

a number of weak P channel transistors, each connected to one of the number of word lines and coupled to receive the input voltage, for providing one of the third and fourth voltages to the number of word lines;

circuitry for operating the weak P channel transistors to provide (1) the fourth voltage to the number of word lines during programming of the memory array and (2) the third voltage to the number of word lines during read of the memory array, wherein the input voltage is at the fourth voltage during programming of the memory array and at the third voltage during read of the memory array.

2. The word line decoder circuit of claim 1, further comprising a number of inverters, each coupled to one of the number of word lines such that when the selected word line is selected, the associative one of the number of inverters of the selected word line outputs the third voltage during read of the memory array and the fourth voltage during programming of the memory array.

3. The word line decoder circuit of claim 1, wherein the first voltage is ground, the second voltage is approximately 5 volts, and the fourth voltage is approximately 12 volts, wherein the third voltage is less than or equal to the second voltage but greater than the first voltage.

4. The word line decoder circuit of claim 1, wherein the circuitry for limiting includes an N channel field effect transistor having a drain and a source connecting the output of the NAND gate to the common node, and a gate coupled to receive the input voltage.

5. The word line decoder circuit of claim 1, wherein each of the number of row decoding and voltage limiting circuits comprises an N channel field effect transistor having a drain and a source connecting the common node to one of the number of word lines, and a gate coupled to receive one of the first and second voltages, wherein the selected word line is selected when the gate of the respective N channel field effect transistor receives the second voltage.

6. The word line decoder circuit of claim 1, wherein the circuitry for operating the weak P channel transistors is connected to a gate of each of the weak P channel transistors, wherein the circuitry for operating the weak P channel transistors applies (1) a zero voltage to the gate of each of the weak P channel transistors during read of the memory array and (2) the fourth voltage minus a doubled threshold voltage of each of the weak P channel transistors during programming of the memory array.

* * * * *